US 7,410,592 B2

(12) United States Patent
Blees

(10) Patent No.: US 7,410,592 B2
(45) Date of Patent: Aug. 12, 2008

(54) STAMP FOR USE IN A LITHOGRAPHIC PROCESS, METHOD OF MANUFACTURING A STAMP, AND METHOD OF MANUFACTURING A PATTERNED LAYER ON A SUBSTRATE

(75) Inventor: Martin Hillebrand Blees, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 779 days.

(21) Appl. No.: 09/759,179

(22) Filed: Jan. 12, 2001

(65) Prior Publication Data

US 2001/0027570 A1    Oct. 4, 2001

(30) Foreign Application Priority Data

Feb. 7, 2000  (EP)  .................................. 00200398

(51) Int. Cl.
*H01L 21/00* (2006.01)
*C23C 16/00* (2006.01)
(52) U.S. Cl. ................... 216/41; 216/8; 216/9; 216/10; 216/13; 216/52; 216/53; 216/58; 216/83
(58) Field of Classification Search ............... 216/8–10, 216/13, 52, 53, 58, 83
See application file for complete search history.

(56) References Cited

U.S. PATENT DOCUMENTS 4,041,114 A    8/1977  Yevick ........................... 264/1

| | | | |
|---|---|---|---|
| 5,201,987 A * | 4/1993 | Hawkins et al. ................. 216/2 |
| 5,512,131 A * | 4/1996 | Kumar et al. ................... 216/13 |
| 5,521,030 A | 5/1996 | McGrew ......................... 430/1 |
| 5,772,905 A * | 6/1998 | Chou ........................... 216/44 |
| 5,817,242 A * | 10/1998 | Biebuyck et al. ............... 216/41 |
| 5,855,755 A * | 1/1999 | Murphy et al. .......... 204/157.15 |
| 5,900,160 A * | 5/1999 | Whitesides et al. ............ 216/33 |

(Continued)

FOREIGN PATENT DOCUMENTS

WO    WO 97/06012    *  2/1997

OTHER PUBLICATIONS

"Soft Lithography" by Y. Xia et al., Angew. Chem. Int. Ed. 1998, vol. 37, pp. 551-575.

*Primary Examiner*—Ram N Kackar
(74) *Attorney, Agent, or Firm*—Douglas McKnight; Michael E. Belk

(57) ABSTRACT

The stamp (10) for a lithographic process, such as patterning a surface layer, of the invention has a stamp body (5) with at least a first recess (11) formed therein, which recess defines a first aperture (15) in the printing face (3) of the stamp (10). The first recess (11) narrows with increasing distance to the printing face, while any cross-section of the first recess, when perpendicularly projected on the printing face (3), will lie within the aperture (15). The printing face may comprise small (11, 12) and large apertures (13) as well as small surfaces (14) in between apertures, while it is nevertheless able to produce prints which are accurate replicas of the printing face. Even details on a submicron scale can be adequately printed. The stamp (10) can be manufactured by a method which comprises anisotropic etching of a first body to make a mold and replicating the mold in the printing face (3) of the stamp (10).

5 Claims, 4 Drawing Sheets

Figure 1:
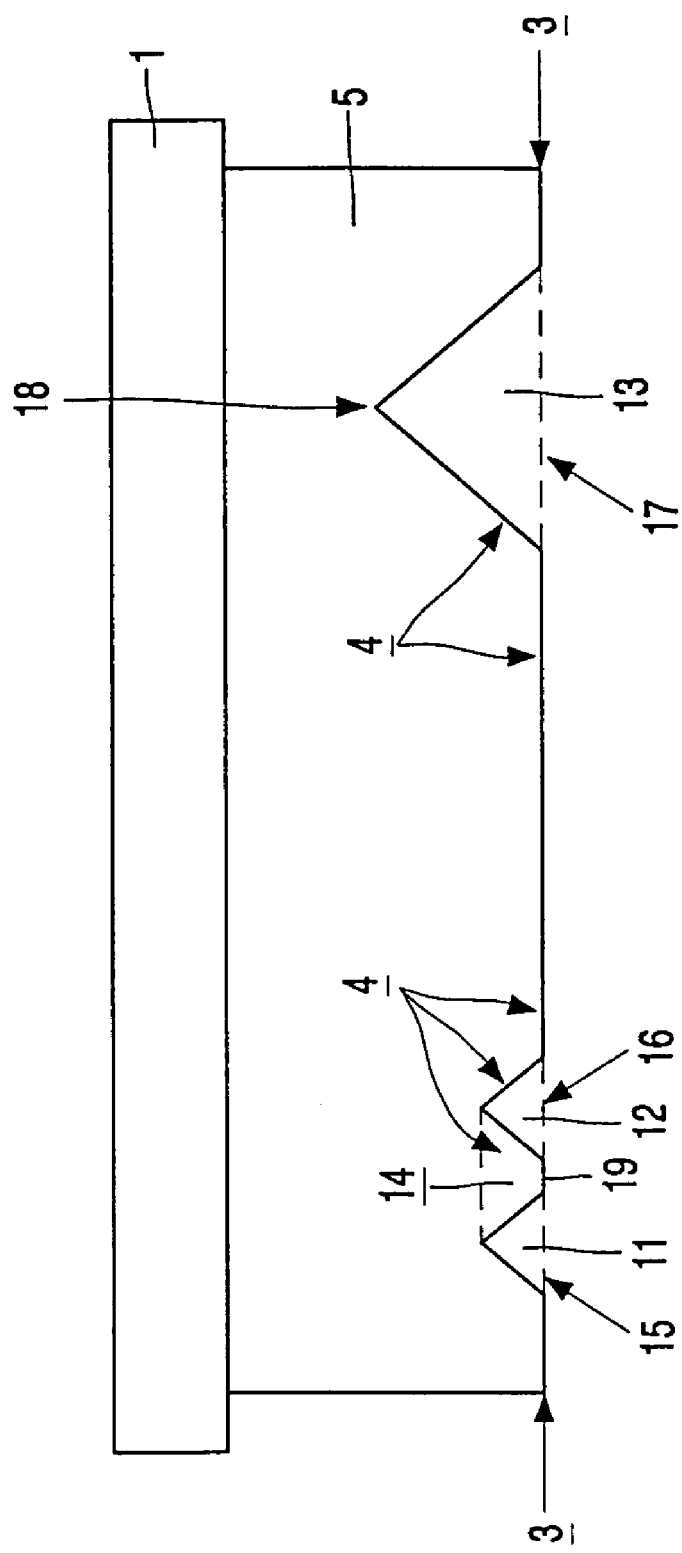

U.S. PATENT DOCUMENTS 5,925,259 A * 7/1999 Biebuyck et al. ................ 216/2
5,937,758 A * 8/1999 Maracas et al. ............. 101/327
5,976,284 A * 11/1999 Calvert et al. ................. 156/51
6,245,412 B1 * 6/2001 Choquette et al. ........... 428/156
6,413,587 B1 * 7/2002 Hawker et al. .............. 427/264

* cited by examiner

STAMP FOR USE IN A LITHOGRAPHIC PROCESS, METHOD OF MANUFACTURING A STAMP, AND METHOD OF MANUFACTURING A PATTERNED LAYER ON A SUBSTRATE

The invention relates to a stamp for use in a lithographic process, which stamp comprises a stamp body with a printing face, said stamp body having a first recess with an aperture in the printing face.

The invention also relates to a method of manufacturing a stamp for use in a lithographic process, which stamp has a stamp body with a surface which coincides partly with the printing face.

The invention further relates to a method of manufacturing an electronic component comprising the step of applying a patterned layer of a first material on a surface of a substrate by means of a stamp provided with a stamp body and a printing face, which stamp body comprises a first recess with an aperture in the printing face, by which method the printing face of the stamp is placed on the surface of the substrate, said first material being present against the printing face, such that the surface of the substrate is provided with the patterned layer.

Such a stamp is known from G.M. Whitesides and Y. Xia, in *Angew. Chem. Int. Ed.* 37 (1998), 500-575. The first, bar-shaped recess is bounded by a bottom and by walls which adjoin the printing face and which are also referred to as side walls. The first recess has a depth which is equal to the distance between the bottom and the printing face. The first recess has a width in the plane of the aperture and a length perpendicular thereto, said width being smaller than or equal to the length. The known stamp is used in lithographic processes which have gained importance in the past years as an alternative to photolithography. Such processes are collectively referred to as "soft lithography". A first example is microcontact printing, where first the first material is provided at the printing face of the stamp, and the stamp is subsequently placed with its printing face on the substrate. A second example is micromolding, where said steps in the lithographic process are carried out in reverse order.

As is mentioned on page 556 in the cited article, the known stamp has the disadvantage that the width/depth ratio of the first recess is limited. This ratio, referred to as the aspect ratio hereinafter, has both a lower and an upper limit, in particular between 0.2 and 2. If the ratio is great, the depth of the first recess is small. Bending of the comparatively large bottom then causes a portion of this bottom to lie in the printing face, and a disturbance in the printing face arrangement arises.

A first measure for preventing such bending is the provision of non-functional posts in the cavity. Such posts are projections which each have a surface in the printing face. When an imprint is made of the stamp surface by means of the stamp, the imprint will also comprise the pattern of the posts, which are additional and without function in the imprint. The provision of the posts splits up the first recess into a number of mutually partly adjoining recesses, each having a smaller aspect ratio than the original first recess.

This measure, however, leads to other disadvantages: thus the mask used in the manufacture of the stamp must be adapted as compared with a standard lithographic mask. Furthermore, the use of a stamp with such projections brings a risk of short-circuits and of the creation of parasitic capacitances in the patterned layer, for example in the manufacture of a patterned electrically conducting layer.

A second measure for preventing bending of the bottom of the first recess is to increase the depth of the first recess. As the depth increases and the aspect ratio decreases, the risk of the side walls of the first recess bending will increase, so that the pattern is not adequately transferred. This disadvantage manifests itself especially if a second recess is present at a short distance from the first recess. The interposed portion of the stamp body may in that case be regarded as a projection whose width is small in relation to its depth, and which has a low stability for that reason.

It is a first object of the invention to provide a stamp of the kind described in the opening paragraph which has a printing face which is comparatively insensitive to disturbances caused by the presence of a first recess having a small or a great aspect ratio.

It is a second object of the invention to provide a method of manufacturing a stamp of the kind described in the opening paragraphs by which a stamp according to the invention can be manufactured.

It is a third object of the invention to provide a method of applying a patterned layer of the kind described in the opening paragraphs whereby the layer is patterned in accurate manner.

According to the invention, the first object is achieved in that the first recess becomes narrower as the distance to the printing face increases, and cross-sections of the first recess parallel to the printing face, when projected perpendicularly on the printing face, lie within the aperture.

In the stamp according to the invention, the cross-section of the first recess decreases as the distance to the printing face increases. In an embodiment, the recess has planar side walls of which at least some enclose an angle smaller than 90° with the printing face. Preferably, each of the adjoining walls of the recess encloses an angle smaller than 90° with the printing face. Said angle is the angle between a first vector n1 which is perpendicular to the printing face and points away from the stamp and a second vector n2 which is perpendicular to a wall of the recess adjoining the printing face and also points away from the stamp. Preferably, said angle is greater than 10° and smaller than 80°. More in particular, the angle is greater than 40° and smaller than 60°. In the stamp according to the invention, the bottom of the first recess is smaller than it is in the known stamp for a given aperture. Bending of the bottom is accordingly effectively counteracted without non-functional posts being included in the stamp. The problems involving the stability accompanying small aspect ratios are at least substantially absent as well in the stamp according to the invention. The narrowing of the first recess with an increasing distance to the printing face necessary involves the effect that the adjoining portions of the stamp body become wider with an increasing distance to the printing face, and are thus stabilized. A further advantage is that the printing face is less sensitive to deviations when forces are exerted on the stamp: since the angle is smaller than 90°, the moment of forces applied to the adjoining portions of the stamp body is smaller. Accordingly, the risk that a side wall will change its position—whereby the size of an aperture would be changed—is reduced.

The bottom of the first recess of the stamp according to the invention may have inter alia a rectangular and a polygonal shape. It is preferred, however, that the bottom substantially has the shape of a line or a dot. Indeed, bending of the bottom cannot take place then. The recess will look like a V-groove in the printing face and have a triangular shape then, viewed in a plane perpendicular to the printing face. The recess as a whole then has the shape, for example, of a cone, a pyramid, or an irregular polyhedron. The shape of the recess depends on the pattern of the printing face of the stamp.

Preferably, a cross-section of the first recess lying at a distance substantially greater than nil from the printing face is at least substantially congruent to the cross-section in the printing face. The angle enclosed by a side wall and the printing face is thus substantially the same for each side wall in each location of the side wall. There is no anisotropy in the printing face: the stabilization of apertures in a first direction is the same as in any second direction. The printing face may accordingly have a pattern in which lines and recesses are curved or angled, while they are still stable in all locations and may have the same dimensions. Such a pattern is desired, for example, in a patterned layer of an integrated circuit.

In general, a second recess will be present in the stamp in addition to the first recess, which second recess has an aperture in the printing face, becomes narrower as the distance to the printing face increases, and has cross-sections parallel to the printing face which, when projected perpendicularly on the printing face, lie within the aperture of the recess. If the recesses adjoin one another, an intermediate portion of the stamp body may be regarded as a first projection. The surface area of a cross-section through this projection taken parallel to the printing face will decrease as the distance to the printing face decreases. The first projection is stabilized thereby. The risk of bending of the projection is reduced. A projection stabilized in this manner may in addition have a very small surface area in the printing face. The size of this surface area is determined by the distance between the aperture of the first recess and the aperture of the second recess. It is favorable when this distance is smaller than 1 micron. It is highly favorable when this distance is smaller than 0.5 micron. That is because this distance defines the minimum dimension in the patterned layer. Small, indeed, ever decreasing dimensions are desired especially in integrated circuits, as is generally known.

In a further embodiment of the stamp according to the invention, a third recess is present besides the first recess, which third recess has an aperture in the printing face, has cross-sections parallel to the printing face, and becomes narrower as its distance to the printing face increases. Furthermore, a projection of a cross-section on the printing face lies within the aperture of the recess. This recess has a length and a width which are mutually perpendicular, said length being greater than or equal to the width. If the aperture has the shape of a rectangle, the length and width extend parallel to the side walls of the recess. In general, the aperture has a dimension in a first direction parallel to the printing face. Said dimension of the aperture is preferably chosen to be the width, especially if the length is much greater than the width.

In the embodiment, the aperture of the third recess has a dimension in a first direction parallel to the printing face which is greater than the dimension of the first aperture in this same direction. A result of this is that the depth of the third recess is greater than or equal to the depth of the first recess. Preferably, the depth of the third recess is greater than the depth of the first recess, because in that case the bottom of the third recess will have a smaller surface area than if said depths were equal.

This embodiment of the stamp according to the invention renders it possible to print patterns with details of different dimensions by means of one and the same stamp. Preferably, the ratio of the size of the aperture of the third recess in a first direction to that of the aperture of the first recess in said direction is at least five. More in particular, this ratio is at least twenty. In particular, this ratio is at least fifty, much higher ratios not being excluded according to the inventor.

The possibility of high ratios between the sizes of the apertures of the recesses is a major advantage, because it should be possible to provide patterns of widely differing sizes and of any shapes whatsoever in the manufacture of an electronic component. When a layer or an etching layer for an integrated circuit is being printed, lines with a cross-section of 0.1 micron and surfaces with a cross-section of 5 microns can be provided in this manner. Thus, for example, active and passive elements can be printed in a layer in an integrated manner. The line is, for example, an interconnect line, while the surface is an electrode of a capacitor.

It may be that the stamp according to the invention comprises besides a first, a second, or a third recess several additional recesses. It is possible for a recess to be continuous from a first edge to a second edge of the printing face.

The stamp body is preferably manufactured from an elastic material. Such material preferably has a Young modulus of between $10^3$ and $10^6$, in particular between $0.25*10^5$ and $5*10^5$ N/m². Examples of such materials are inter alia poly (dimethylsiloxane), which material is also known as PDMS, poly(butadiene), poly(acrylamide), poly(butylstyrene), and copolymers of these materials. It is desirable to optimize the properties of the elastic layer so as to control the desired amount of flexibility. The stamp body may alternatively comprise a material having a high Young modulus, preferably above $10^6$ N/m². It is favorable in this embodiment to include a layer of an elastic material in the stamp.

The stamp according to the invention may be used in a lithographic process, in particular in a sub-micron lithographic process in which patterns of various shapes are provided on a substrate in a reliable and accurate manner. Examples of lithographic processes in which the stamp according to the invention can be used are inter alia microcontact printing, micromolding, microtransfer molding, replica molding, and solvent-assisted micromolding. The stamp according to the invention may further be utilized in a lithographic process in which light is directed through the stamp. Such lithographic processes are known per se.

The second object of the invention is realized by a method of the kind mentioned in the opening paragraphs, which method comprises the steps of:

anisotropic etching of a surface of a mold into a patterned mold surface, such that a first recess arises in the mold with an aperture in the original surface, which first recess becomes narrower as its distance to the original surface increases and has cross-sections parallel to the original surface which, when projected perpendicularly on the original surface, lie within the aperture, and making a replica of the patterned mold surface in a first body with a patterned surface.

The first recess has at least one first side wall which encloses an angle not equal to 90° with the mold surface. Preferably, the angle is greater than 10° and smaller than 80°. More in particular, the angle is greater than 40° and smaller than 60°. This angle is defined as the angle between a first vector $n1$ which is perpendicular to the original surface and points away from the mold and a second vector $n2$ which is perpendicular to a wall of the recess adjoining the original surface and also points away from the mold. Preferably, the mold comprises several additional recesses in addition to the first recess after patterning.

Preferably, the mold comprises mainly silicon and the first surface used for etching is the (100) surface, which is commercially available as a silicon wafer. Before etching, for example, an etching mask is provided directly on the surface. The etching process may be a wet chemical etching process.

The technique of dry etching, inter alia through the use of a plasma, may also be used. The etching mask is subsequently removed, if so desired.

The etching process preferentially exposes the crystallographic planes in the (111), (1(−1)1), (1(−1)(−1)), and (11(−1)) directions. These planes, referred to hereinafter as the (111) planes, all enclose an angle of approximately 55° with the (100) plane. The result is that the recesses formed have cross-sections parallel to the original surface which are at least substantially congruent to the aperture in the original surface. If the etching process is not actively stopped, it will end of its own accord. This automatic stop occurs when the surface of the bottom of a recess has been reduced down to a line or point. The etching mask may be removed after etching. The result is that the surface of the mold is patterned. The mold surface, which was planar prior to etching, has become a surface comprising variations in three dimensions. This patterned mold surface is subsequently replicated in a first body.

It is an advantage of the method according to the invention that it is accurate and produces stable stamps. Compared with the provision of recesses by means of laser ablation, moreover, the method is not very labor-intensive.

The first body may be the stamp body if the recesses have equal depths. The surface of this body is in fact the negative of the patterned mold surface. The portion of the mold surface which shaped the bottoms of the recesses lies in the printing face in the first body. The recesses in the mold are replicated as projections on the bottoms of the recesses in the stamp body. The printing face of the stamp formed comprises the surfaces of the projections. These surfaces each have a given size caused by the fact that the etching process was stopped at a desired depth.

The embodiment has the advantage inter alia that, starting from one lithographic mask, different molds can be manufactured in that anisotropic etching takes place to a different depth each time. It is an additional advantage that the surface areas of the projections decrease in proportion as the etched depth increases. The stability of the projections is thus ensured by the shape of the projections, the size of which decreases towards the printing face. This embodiment of the method according to the invention thus offers the possibility of manufacturing a stamp with a printing face provided with details having dimensions of less than 100 nm.

In an alternative embodiment of the method according to the invention, a replica is made of the patterned surface of the first body in a second body having a patterned surface. The first body in this embodiment is an intermediate replica. The surface of the mold cannot be directly replicated to the surface of the stamp body if both surfaces are one another's positive copies. A first advantage of being positive copies, however, is that the simple technique of anisotropic etching can be used for manufacturing stamp bodies provided with recesses of different depths. It is a further advantage of the use of an intermediate replica that the mold need not be used often, so that it is hardly subject to wear.

To remove the first body from the mold and the second body from the first body, it is preferable to provide an unmolding agent on the surface of the mold or of the first body, as applicable. The unmolding agent is, for example, a fluorosilane. It is preferable that the unmolding agent is applied by means of vacuum deposition.

A coating technique may be used for applying material on the mold or on the first body. Examples of coating techniques are spin coating and web coating. A first advantage of this is that a large surface can be coated. It is then possible to manufacture a large number of stamps in one operation. A second advantage is that a second surface facing away from the printing face is well planarized. This renders it possible to fasten this second surface, which is normally substantially parallel to the printing face, to a reinforcement body of any shape, such as a cylindrical reinforcement body. The material is cured after its application, whereupon the replica is removed from the mold or the first body.

It is alternatively possible for an injection molding technique to be used for applying material on the mold or on the first body. An advantage of this technique is inter alia that the surface facing away from the printing face can be adhered to a reinforcement body of any shape, such as, for example, a metal band. Such a metal band with the stamp body fastened on it may be, for example, tensioned around a cylindrical roller.

The third object of the invention is achieved by a method of manufacturing an electronic component comprising the step of applying a patterned layer of the kind described in the opening paragraphs in that a stamp as claimed in claim 1 is used. This leads to a higher accuracy. A required accuracy in the result indeed means that little or no deviation should occur in all steps leading to the result. This method according to the invention is less sensitive to deviations in at least three steps. First, the stamp body is more robust. Bending of the bottom of a recess or bending of a projection is effectively counteracted in the stamp as defined in claim 1. Second, the surface area of the mold surface has been reduced, which reduces the risk of deviations in the replication of the mold surface to the surface of the stamp body. Third, the method according to the invention is less sensitive to variations in the exertion of a force during the transfer of a first material from the printing face to the substrate. This sensitivity relates in particular to the operation of bringing the printing face of the stamp into contact with the substrate surface, during which a force is exerted. In experiments, the method according to the invention is found to have a low sensitivity to variations in the force applied, both as regards the value of the force and as regards the spread of the value of the force over the contact surface between the stamp and the substrate.

A first advantage of the method according to the invention is that the higher accuracy with which a patterned layer is provided on a substrate leads to a higher yield. In fact, there are fewer layers which have to be rejected on account of a defect or deviations outside the tolerances. A second advantage is that the pattern of the patterned layer can contain details on a sub-micron scale. A third advantage is that the pattern can contain details of varying dimensions.

These advantages are important for the manufacture of patterned layers within electronic components such as displays, lamps, networks of passive components, discs used for data storage, and integrated circuits. As an example integrated circuit: the higher yield is important because a large number of patterned layers is to be provided for an integrated circuit. The details on the sub-micron scale are important for an integrated circuit because the speed of the circuit is partly determined by the size of the details which define a channel in a transistor. The difference in size between details within one pattern is of importance because integrated circuits often comprise patterned layers with intricate details, which details have different functions.

The first material which is provided at the printing face of the stamp, either on the surface or in the recesses, is usually a solution or suspension of a desired compound in a solvent or dispersing agent. An alcohol such as ethanol is a frequently used solvent. The pattern which is provided on the substrate by means of the stamp may have a layer thickness of a few nanometers. An example of a layer with such a layer thickness is a layer of a linear thiole which is present as a self-assembled monolayer on a suitable substrate such as substrate at the surface which comprises a layer of mainly gold. Greater layer thicknesses, however, are by no means excluded.

A wide variety of inorganic, organic, and polymeric materials may be used as the first material. A condition here is, however, that the dispersing agent or solvent in which the first material is present during its application on the printing face does not cause the material of the stamp body to swell. Examples of first materials are, inter alia, coatings in lamps, electrically insulating, semiconducting, and conducting materials in passive components, networks of passive components and semiconductor devices, and masks for patterning the substrate by optical, chemical, or electromagnetic means.

It is favorable when the first material is an electrically conducting or semiconducting organic material. The conduction of such materials may be enhanced through the use of dopants. The method of manufacturing a patterned layer according to the invention renders it possible to provide doped, electrically conducting organic materials and undoped electrically semiconducting organic materials patterned on a substrate in a simple manner. Examples of such organic materials are inter alia pentacene, polythienylene-vinylene, polyfuranylene-vinylene, polyphenylene-vinylene, polythiophene, polyaniline, polypyrrole, polyacetylene, and substituted variants of these materials. Substituents are inter alia alkoxy, alkyl, and alkylenedioxy groups with preferably 1 to 10 carbon atoms.

In an alternative embodiment, the first material takes part in a reaction which takes place at the surface of the substrate. The term reaction here relates to chemical reactions, etching, or dissolving reactions as well as surface modifications through physical processes such as diffusion. The first material may in that case be present at the printing face, but also in the recesses. The stabilization of projections at the printing face of the stamp is very advantageous for this embodiment: the projections are highly resistant to the comparatively great forces exerted by the liquid in the recesses.

Figure 3A:
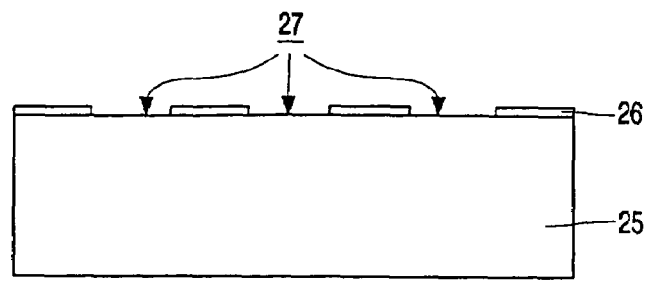
Figure 3B:
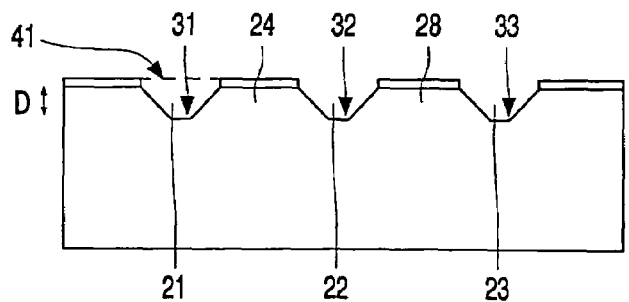
Figure 3C:
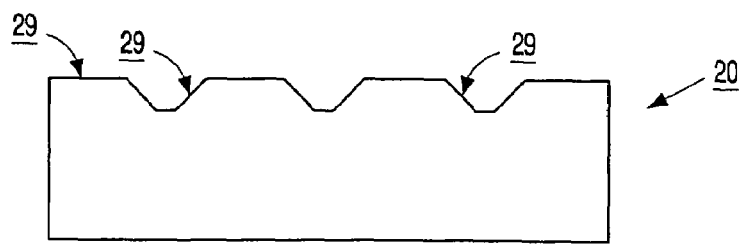
Figure 3D:
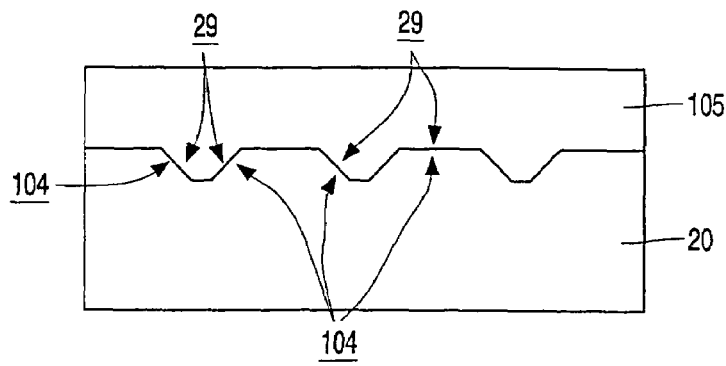
Figure 3E:
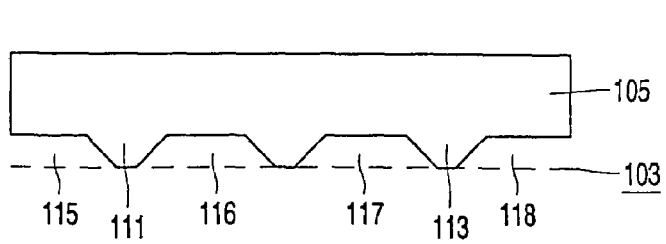
Figure 4:
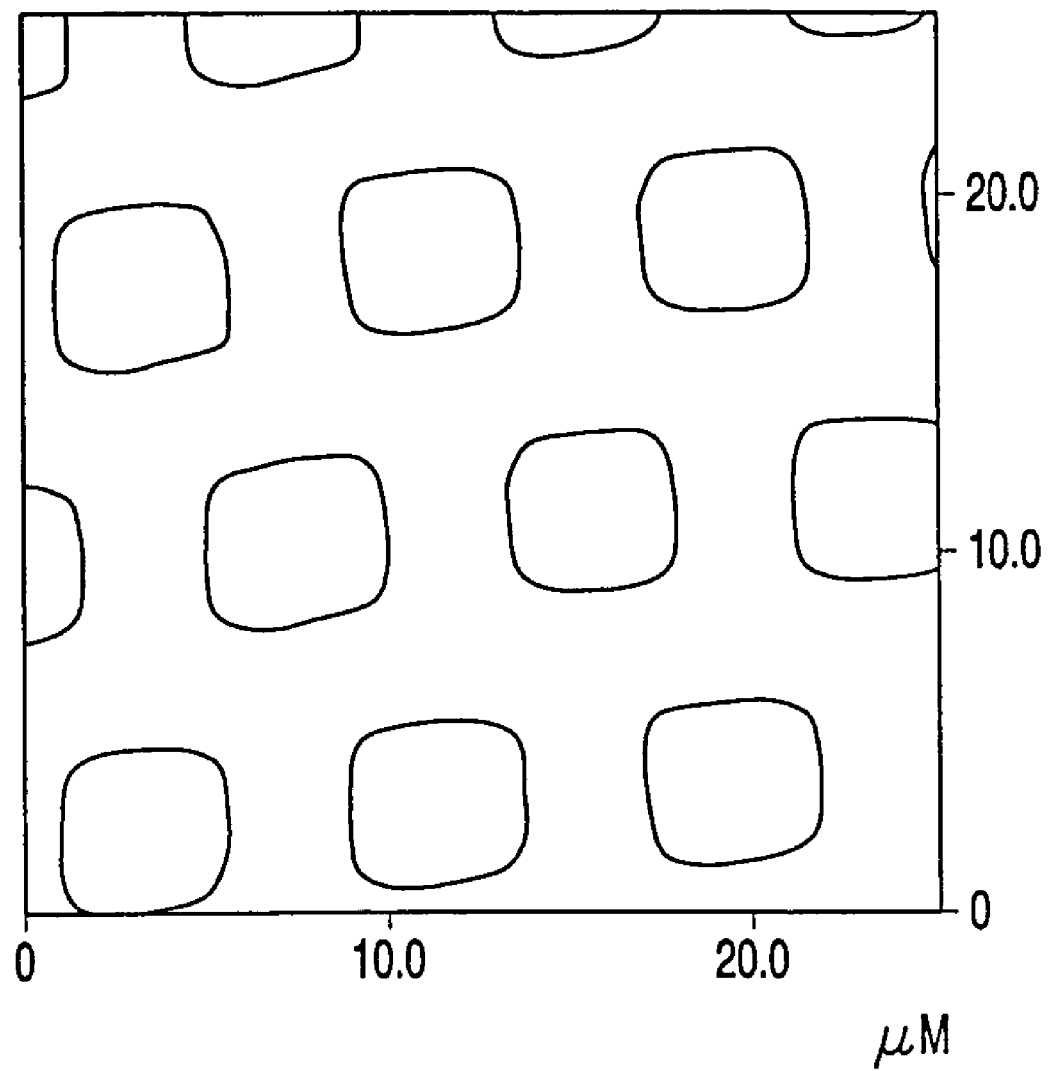

These and other aspects of the stamp and the methods according to the invention will be explained in more detail below with reference to drawings and embodiments, in which:

FIG. 1 is a diagrammatic side elevation of a first embodiment of the stamp;

FIG. 2 diagrammatically depicts a first embodiment of a number of steps of the method of manufacturing a stamp;

FIG. 3 diagrammatically depicts a second embodiment of a number of steps in the method of manufacturing a stamp; and FIG. 4 is a plan view of a pattern which can be manufactured by the method of manufacturing a patterned layer.

FIG. 1 shows a cross-section of a first stamp 10 according to the invention taken perpendicularly to a printing face 3. The first stamp 10 comprises a supporting structure 1 and a stamp body 5 which is provided with a surface 4 of which a portion is present in the printing face 3. A first recess 11, a second recess 12, and a third recess 13 are provided in the stamp body 5, which recesses have their apertures 15, 16, and 17 in the printing face 3. A first projection 14 with a surface 19 in the printing face 3 is present between the first and the second recess 11, 12. The projection 14 is stabilized in that it becomes wider with an increasing distance to the printing face 3. The first aperture 15 and the third aperture 17 in the printing face are of different sizes. No bending occurs in the third aperture 17, however, because the bottom 18 of the recess 13 has a small surface area.

FIG. 2 shows a first method according to the invention for the manufacture of a first stamp 10 in seven steps. FIG. 2a shows the result of the first step in which an etching mask 26 is provided on a surface 27 of a layer 25. Etching takes place subsequently, with the result that recesses 21, 22, and 23 and a projection 24 are created. These are depicted in FIG. 2b. Recess 21 has an aperture 41 in the original surface 27. The recess 21—like the recesses 22 and 23—narrows as its distance to the original surface 27 increases and has cross-sections parallel to this original surface 27 which, when projected perpendicularly on the original surface 27, lie within the aperture 41.

Figure 2A:
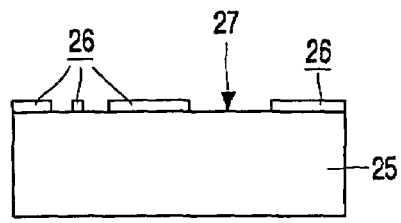
Figure 2B:
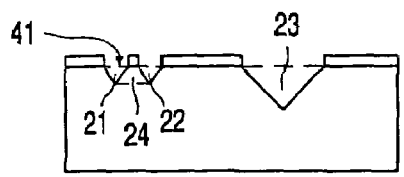
Figure 2C:
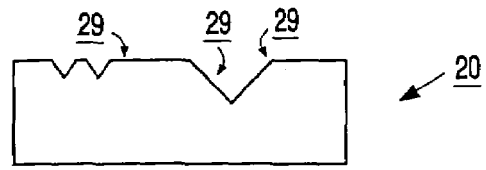
Figure 2D:
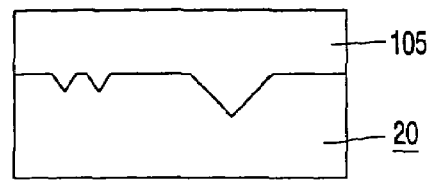
Figure 2E:
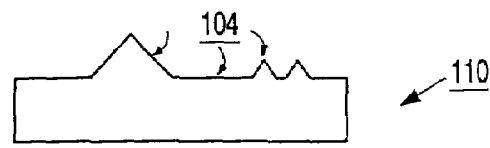
Figure 2F:
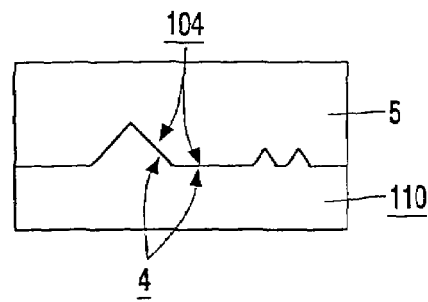
Figure 2G:
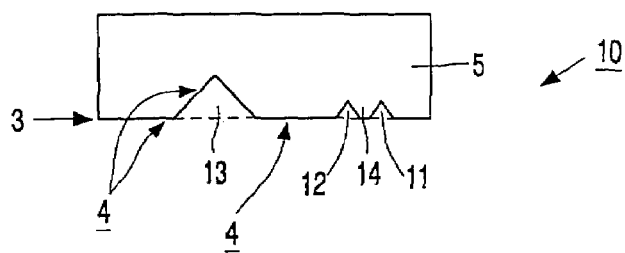

The etching mask 26 is then removed. The mold 20 with a mold surface 29 is the result, as shown in FIG. 2c. A layer 105 is provided on the mold 20, in which layer the mold surface 29 is replicated. This is shown in FIG. 2d. Then the mold 20 is removed from the layer 105. The first body 110, shown in FIG. 2e, is ready now and is provided with a surface 104 which is a negative of the mold surface 29. A layer 5, in which the surface 104 is replicated, is now provided on the first body 110. This is shown in FIG. 2f. Then the first body 110 is removed from the layer 5. The stamp body 5, shown, in FIG. 2g, of the stamp 10 is ready now and has a surface 4. This surface 4 lies partly in the printing face 3.

FIG. 3 shows a second method according to the invention for the manufacture of a second stamp 110 in five steps. FIG. 3a shows the result of the first step in which an etching mask 26 is provided on a surface 27 of a layer 25. Etching takes place subsequently, with the result that recesses 21, 22, and 23 with respective bottoms 31, 32 and 33 and projections 24, 28 are created. Etching is stopped upon reaching of the depth D. This is depicted in FIG. 3b. The recess 21 has an aperture 41 in the original surface 27. The recess 21—like the recesses 22 and 23—becomes narrower as its distance to the original surface 27 increases, and has cross-sections parallel to this original surface 27 which, when projected perpendicularly on the original surface 27, lie within the aperture 41.

The etching mask 26 is subsequently removed. The mold 20 with mold surface 29 is the result, as shown in FIG. 3c. A layer 105, in which the mold surface 29 is replicated, is provided over the mold 20. This is shown in FIG. 3d. Then the mold 20 is removed from the layer 105. The mold surface 29 has been replicated in the surface 104 of the stamp body 105 thereby. The second stamp 110 shown in FIG. 3e is ready now, provided with a printing face 103 which is a negative of the bottoms 31, 32, and 33 of the mold 20. The printing face 103 comprises the surfaces of the projections 111, 112, and 113.

Embodiment 1

Manufacture of the mold

A wafer of Si (100) with a diameter of 4 inches is coated with a layer of $Si_3N_4$. This layer is deposited in an LPCVD process by means of $SiH_2Cl_2$ and $NH_3$ in the gas phase at a temperature of approximately 800° C. A thin layer of positive photoresist is provided on this wafer by means of spin coating. After UV irradiation through a mask and a developing step, a photoresist pattern is obtained on the wafer. The exposed $Si_3N_4$ is then etched in plasma of $CHF_3$ and $O_2$, during which the temperature remains below 100° C. (etching rate 1.25 nm/s). The photoresist is removed in an oxygen plasma. Then the natural oxide is removed in that the wafer is immersed in an aqueous HF solution. The exposed Si is anisotropically etched for 20 minutes in a $KOH$—$H_2O$ solution saturated with 2-propanol at a temperature of approximately 70° C. to a depth of 13 μm or a little more. Then the wafer is immersed for 30 minutes in an aqueous HCl solution. The natural $SiO_2$ is removed from the $Si_3N_4$ in that the wafer is immersed for a short period in a dilute aqueous HF solution. The $Si_3N_4$ is now removed in that the wafer is immersed in concentrated $H_3PO_4$ at a temperature of between 125 and 150° C. for one and a half to two hours.

After rinsing, the Si wafer is treated for 15-30 minutes in an UV/ozone reactor. The wafer is introduced into a vacuum desiccator together with approximately 0.5 ml of (heptadecafluoro-1,1,2,2-tetrahydrodecyl)trichlorosilane. The desiccator is exhausted down to a pressure of approximately 0.4 mbar. After 30 minutes, the desiccator is vented and the wafer is put in a preheated oven for one hour.

Making a Replica of the Mold Surface in a First Body

The negative of the mother is made from Sylgard 184 silicone rubber (Dow Corning). 30 g of Sylgard 184 "base" and 3 g of Sylgard 184 "curing agent" are thoroughly mixed by stirring in a polystyrene disposable holder. Any air bubbles enclosed as result of this are removed by venting at low pressure (≈0.5 mbar) during approximately half an hour. The Si blank wafer is introduced in a closed perspex polymerization mold with an injection opening. This polymerization mold is introduced into a vacuum bell and exhausted down to ~0.5 mbar. A funnel is filled in the vacuum with the Sylgard 184 mixture and connected to the polymerization mold. Aeration of the bell causes the Sylgard 184 mixture to be sucked into the perspex polymerization mold. The perspex polymerization mold is put in a preheated oven for 16-20 hours at 65° C. Then the perspex polymerization mold is opened and the first body is removed from the polymerization mold.

Manufacture of the Stamp

After the first body has been coated by deposition of (heptadecafluoro-1,1,2,2-tetrahydrodecyl)trichlorosilane in a vacuum desiccator, the silicone negative is introduced into a closed perspex polymerization mold. This is introduced into a vacuum bell and exhausted down to ~0.5 mbar. A funnel is filled in vacuum with freshly made and vented Sylgard 184 mixture and connected to the polymerization mold. Aeration of the bell causes the Sylgard 184 mixture to be sucked into the polymerization mold. The polymerization mold is put in a preheated oven for 16-20 hours at 65° C. Then the polymerization mold is opened and the entire assembly of the first body and the stamp body is removed therefrom. The stamp body is subsequently removed from the first body. The side of the stamp body remote from the printing face is fastened to a supporting structure, such as a glass layer. The stamp provided with its supporting structure may be used in a lithographic process, for example for microcontact printing.

Embodiment 2

A first layer of approximately 5 nm titanium and subsequently a layer of approximately 20 nm gold are provided on a silicon substrate. The substrate is thus provided with a layered surface at a first side. A stamp manufactured in the manner described in embodiment 1 and provided with a printing face is brought with its printing face into contact with a $10^{-3}$ mole/l solution of octadecylthiole in ethanol. The stamp is subsequently treated with a nitrogen flow. Then the printing face of the stamp is brought into contact with the surface of the substrate and is removed therefrom after some time. The substrate is subsequently immersed for 5 to 10 minutes in a 1 mole/l KOH solution in water to which a little $K_2S_2O_3$, $K_3Fe(CN)_6$, and $K_4Fe(CN)_6$ have been added. Then the substrate is rinsed with water and dried. The gold layer on the substrate has thus been patterned in accordance with a pattern corresponding to the pattern on the printing face of the stamp. The pattern, of which a plan view is shown in FIG. 4, has thus been created.

The invention claimed is:

1. A method of manufacturing a stamp for use in a lithographic process, which stamp has a stamp body with a surface which coincides partly with the printing face, comprising the steps of:

anisotropic etching of a surface of a mold into a patterned mold surface, such that a first recess and a second recess are created in the mold with apertures in the original surface, which first recess and a second recess become narrower as its distance to the original surface increases and has cross-sections parallel to the original surface which, when projected perpendicularly on the original surface, lie within the aperture, and wherein the first and second recesses have different apertures:

disposing an unmolding agent between the mold and a first body; and making a replica of the patterned mold surface in the first body with a patterned surface, wherein the replica contains structures of different sizes, characterized in that a replica is made of the patterned surface of the first body in a second body which has a patterned surface.

2. A stamp for use in a lithographic process, which stamp comprirses a stamp body with a printing thee, said stamp body having a first recess with an first aperture in the printng face, wherein the first recess becomes narrower as its distance to the printing face increases, and cross-sections of the first recess parallel to the printing face, when projected perpendicularly on the printing face, lie within the first aperture, and a third recess with an third aperture in the printing face and a depth perpendicular to the printing face that is greater than the depth of the first recess is present in the stamp body, which third recess has cross-sections parallel to the printing face and becomes substantially narrower as its distance to the printing face increases, said cross-sections, when projected perpendicularly on the printing face, lying within the third aperture, the aperture of the third recess and the aperture of the first recess each have a dimension in a first direction in the printing face, and said dimension of the aperture of the third recess is at least five times the dimension of said aperture of the first recess, wherein at least one of the first and third recesses has a triangular shape in a plane perpendicular to the printing face;

wherein the stamp body has a Young modulus greater than $10^6$ $N/m^2$, and the stamp body further has an elastic layer disposed therein.

3. A stamp as claimed in claim 2, characterized in that the first recess has a triangular shape in a first plane perpendicular to the printing face.

4. A stamp as claimed in claim 2. characterized in that a second recess with an second aperture in the printing face is present in the stamp body, which second recess has cross-sections parallel to the printing face and becomes narrower as its distance to the printing face increases, said cross-sections, when projected perpendicularly on the printing face, lie within the second aperture, and said second aperture is present at a distance smaller than 1 μm from the aperture of the first recess.

5. A stamp as claimed in claim 2, characterized in that said dimension of the aperture of the third recess is at least twenty times said dimension of the aperture of the first recess.

* * * * *